United States Patent [19]

Smith

[11] Patent Number: 4,805,185
[45] Date of Patent: Feb. 14, 1989

[54] TRIPLE CAVITY LASER

[75] Inventor: Robert J. Smith, St. Louis County, Mo.

[73] Assignee: The United States of America as represented by the Secretary of the Air Force, Washington, D.C.

[21] Appl. No.: 836,043

[22] Filed: Mar. 4, 1986

[51] Int. Cl.$^4$ .......................... H01S 3/082; H01S 3/08
[52] U.S. Cl. ......................................... 372/97; 372/49; 372/99; 372/92; 372/32
[58] Field of Search ....................... 372/97, 92, 98, 25, 372/99, 29, 49, 43, 19, 32

[56] References Cited

U.S. PATENT DOCUMENTS

| | | | |
|---|---|---|---|
| 3,617,930 | 11/1971 | Snitzer et al. | 372/32 |
| 3,628,173 | 12/1971 | Danielmeyer | 372/32 |
| 3,663,890 | 5/1972 | Schulthess et al. | 372/97 |
| 3,987,373 | 10/1976 | Mohler | 372/92 |
| 4,079,339 | 3/1979 | Kobayashi et al. | 372/97 |
| 4,081,760 | 3/1978 | Berg | 372/100 |
| 4,097,818 | 6/1978 | Manoukian et al. | 372/98 |
| 4,156,206 | 5/1979 | Comerford et al. | 372/50 |
| 4,446,557 | 5/1984 | Figueroa | 382/45 |
| 4,503,541 | 3/1985 | Weller et al. | 372/50 |
| 4,550,410 | 10/1985 | Chenausky et al. | 372/97 |

FOREIGN PATENT DOCUMENTS 56-645091 4/1981 Japan .
56-15886 11/1981 Japan .

OTHER PUBLICATIONS

Y. C. See et al., "Coupled Optical Resonators for the Enhancement of Laser Intracavity Power", Apr. 1, 1981, *Applied Optics,* vol. 20, No. 7, pp. 1211–1217.

*Primary Examiner*—James W. Davie
*Assistant Examiner*—Georgia Y. Epps
*Attorney, Agent, or Firm*—Jules J. Morris; Donald J. Singer

[57] ABSTRACT

The invention comprises a semiconductor laser 10 having an attached etalon 18 which imposes two additional reflective cavity resonance conditions on a laser diode 12. The etalon has partially reflective front surface 26 and an inner surface 24 which act in conjunction with the internal cavity of the laser diode 12 to reduce side mode emission from the laser. This results in laser emission of a single dominant mode, i.e., a single discrete wavelength of coherent light, from surface 22.

8 Claims, 6 Drawing Sheets

PLANE WAVE REFLECTIVITY

TRIPLE CAVITY LASER

STATEMENT OF GOVERNMENT INTEREST

The invention described herein may be manufactured and used by or for the Government for governmental purposes without the payment of any royalty thereon.

TECHNICAL FIELD

This invention relates to semiconductor lasers and is particularly directed to single mode semiconductor lasers suitable for pulsed operation.

Generally, the most desirable laser diodes are those whose emissions are characterized by a single lobe far field image. These lasers are said to operate with a fundamental transverse mode. In the following description, this type of laser diode will be considered exclusively; advantages of this invention, however, may be applicable to other types of lasers.

Most laser diodes are constructed with a longitudinal axis or longitudinal cavity from which light is emitted at one or both ends. The ends of laser diodes, are typically either cleaved or coated so that they are partially or totally reflective. Reflected light at wavelengths that resonate constructively within the laser cavity stimulates further light emissions in phase with the stimulating wave, which thereby builds in power. Light at wavelengths which satisfies the resonance conditions of the cavity and is reflected with the maximum feedback and minimum cancellation (i.e., constructively) is said to satisfy the Fabry Perot resonance condition. Lightwaves at a number of wavelengths thus build in power and are referred to as longitudinal, or axial, modes. Typical isolated laser diodes emit a family of such coherent axial modes along their longitudinal axis. The modes can be considered a family of discrete wavelengths that are spaced several angstroms apart. These axial modes are formed within the broader emission spectra that diode junctions of selected materials are capable of emitting. The multitude of axial mode emissions can have spectral emission widths of up to 200 angstroms.

The axial modes which are actually emitted by a particular laser diode depends on peculiarities of the laser diode gain line (preferred operating wavelength), inhomogeneous broadening of the laser emission spectra and how efficiently light passes through the diode to be reflected, as opposed to being reabsorbed or scattered. Pulsed diode operation, as is required for data transmission, tends to further lower diode efficiency and increase the number of operative axial modes. All these factors can act to promote multiple axial mode operation with as many as fifty modes vying for dominance.

For many applications a single stable longitudinal (axial) mode emission is required to maximize efficiency and emission power. A large variety of diodes have been designed for single longitudinal mode operation. Most of these designs rely on feedback enhancement through coherent superposition of selected wavelengths. Unfortunately, most of these designs also have considerable drawbacks.

One such design makes use of an external mirror positioned parallel to a cleaved face of a laser diode. This imposes a second Fabry Perot resonance condition on the emission spectrum to help establish a dominant operating mode and suppresses side modes. This method does improve single mode operation, but unfortunately, side mode suppression is poor during pulsed operation.

Another method that improves single mode operation was pioneered by Bell Laboratories. It is the cleaved coupled cavity (C3) approach in which a diode is grooved or cleaved to create a second resonant cavity. Unfortunately, it is difficult to apply protective coating to the internal facets of the cleaved cavity. As a result, oxidation of the internal cleaved surfaces causes deterioration of the laser emission spectrum after prolonged use. This method also requires the added complication of three port drive electronics since both sides of the cleaved diode must be powered.

Yet another single mode design is known as the distributed feedback approach and requires an internal diffraction grating. This type of device is difficult to manufacture and not generally commercially available. Finally, external gratings have also been tried. This design has yielded uneven results and is expensive to manufacture.

In view of the above a need exists for a laser diode capable of reliable single mode operation.

It is also clear that a particular need exists for a laser diode that is capable of predominantly single mode pulsed operation. This is because pulsed operation is the standard method of data transmission. Multiple mode operation gives rise to pulse spreading in fiber optic transmission lines and limits transmission distances. Data rates are also limited because of the time it takes for conventional laser diodes to establish a dominant mode.

It is therefore an object of this invention to provide a semiconductor laser capable of single axial mode operation both in continuous and pulsed operation.

It is a further object of this invention to provide a single axial mode semiconductor laser that is relatively easy to manufacture and operate.

It is yet a further object of this invention to provide a single axial mode semiconductor laser that is substantially tunable to a preferred discrete operating wavelength.

SUMMARY OF THE INVENTION

The invention comprises a laser diode of the double heterojunction or similar type having a partially reflective front facet along a longitudinal axis, the laser diode being attached to an external etalon having dual reflective surfaces.

In the preferred embodiment of the invention light emitted from a diode junction is (1) partially reflected internally within the diode by cleaved cavity ends, establishing a first Fabry Perot resonance condition, (2) partially reflected externally from a external etalon surface back into the diode, establishing a second Fabry Perot resonance condition, and (3) reflected from an internal etalon surface back through the etalon and into the laser diode to establish a third Fabry Perot resonance condition. The imposition of the spectra associated with the three Fabry Perot cavities changes the effective reflectivity of the front end of the laser diode cavity. This reduces the operative axial modes of the diode above the lasing threshold to one discrete wavelength.

In the preferred embodiment of the invention the etalon is attached to the laser diode by elastic material such as room temperature vulcanizing rubber (RTV).

BRIEF DESCRIPTION OF THE DRAWINGS

The foregoing and other objects and advantages of the invention will be apparent from the following more particular description of the preferred embodiment of the invention, as illustrated in the accompanying drawings, in which like reference characters refer to the same parts throughout the different views. The drawings are not necessarily to scale, emphasis instead being placed upon illustrating the principles of the invention.

DETAILED DESCRIPTION OF THE PREFERRED EMBODIMENT

Figure 1:
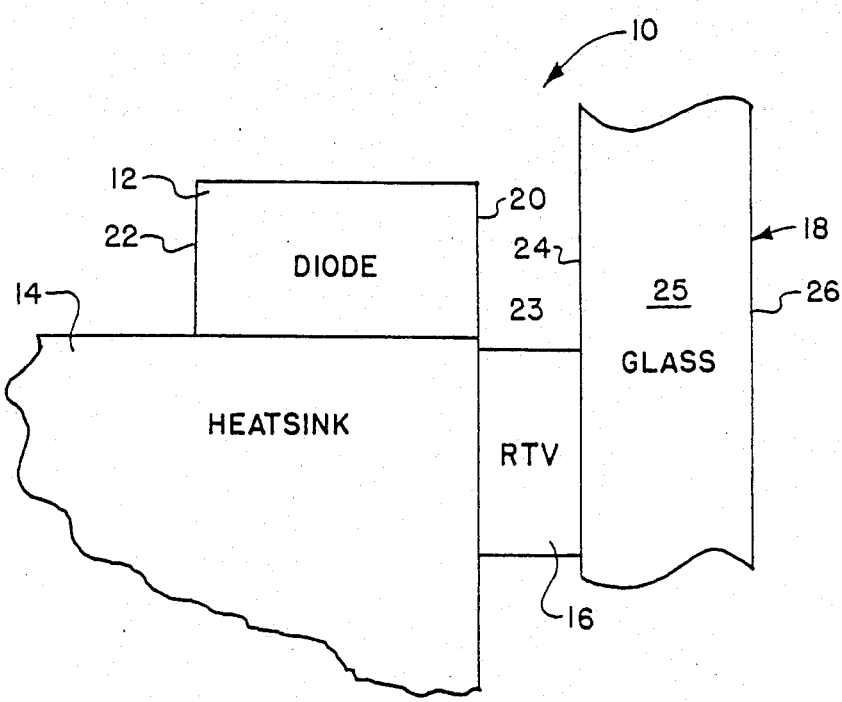
FIG. 1 is a plan view of a semiconductor laser incorporating the principles of this invention.

FIG. 1 is a simplified plan view of a semiconductor laser incorporating the principles of this invention. The semiconductor laser 10 comprises a laser diode 12 mounted to a heatsink 14 which is attached by an elastic material 16 to a dielectric slab, or etalon 18. The etalon 18 is made of glass or other suitable transparent material.

The laser diode 12 emits longitudinally at facets 20 and 22. Both facets 20 and 22 are standard partially reflecting laser diode cleaved ends. Emissions at facet 20 pass through the etalon 18 to provide the output beam of the laser.

The etalon has a first partially reflective surface 24 most adjacent to the diode 12 and a front laser emission surface 26 that is also partially reflective. Light emitted by the diode from surface 20 is reflected back into the diode at surfaces 24 and 26 of the etalon. Reflective feedback of emitted coherent laser light from both of the etalon surfaces modulates the effective reflectivity of diode facet 20 with respect to wavelengths of the light produced by the semiconductor junction within the laser diode 12. For a given wavelength to experience maximum reflectivity and hence maximum retransmission into the laser diode 12, it must satisfy the three Fabry Perot resonance conditions set up by the diode itself, the etalon front surface 26 and etalon rear surface 24.

These three Fabry Perot resonance conditions are fixed by the diode length, the air gap between facet 20 of the diode and surface 24 of the etalon and the thickness of the etalon 18. The imposition of the three Fabry Perot resonance conditions virtually eliminates side modes above the diode lasing threshold bias and establishes one of the diodes natural Fabry Perot wavelengths as the dominant emission mode. This is because the lasing threshold of the dominant mode is lowered as a result of its higher reflectivity which promotes increased stimulated emissions in phase with the dominant mode. In contrast, the lasing thresholds of the side modes are raised since they are reflected with less efficiency and thus their poorer reflections do not stimulate in phase photon emission nearly as well as the dominant mode.

As mentioned above, a laser diode in isolation will operate with a series of resonant modes but the addition of two more Fabry Perot resonance cavities largely eliminates most of these modes. The Fabry Perot resonance conditions of the three cavities may be stated mathematically as follows:

(1) $m\lambda = 2Nl$ [diode cavity]
(2) $(m'+\frac{1}{2})\lambda = 2s$ [air gap cavity]
(3) $m'' = 2(nt+s)$ [glass+air gap cavity]

The letters m, m' and m", are arbitrary integers, "s" is the diode to etalon separation (air gap), "n" is the refractive index of the etalon and "t" is the etalon thickness.

Each cavity, therefore, has an associated Fabry Perot spectrum in which the separation between possible resonant modes is given by one of the three following equations:

$$\Delta\lambda = \lambda^6/(2Nl) \text{ [diode cavity]}$$

$$\Delta\lambda' = \lambda^2/2s \text{ [air gap cavity]}$$

$$\Delta\lambda'' = \lambda^2/2(nt+s) \text{ [glass+air gap cavity]}.$$

For example, if $\lambda = 0.83$ microns, $N=4$, $l=280$ microns, $s=60$ microns, $n=1.5$ and $t=150$ microns, then $\Delta\lambda=3.1$ Å (angstroms), $\Delta\lambda'=57$ Å and $\Delta\lambda''=12$ Å.

At wavelengths for which all three reflections are in phase, axial (longitudinal) reflectivity can be as high as 60 percent. At those wavelengths for which both etalon reflections are completely out of phase with the diode facet reflection, axial reflectivity falls to about 5 percent.

Figure 2:
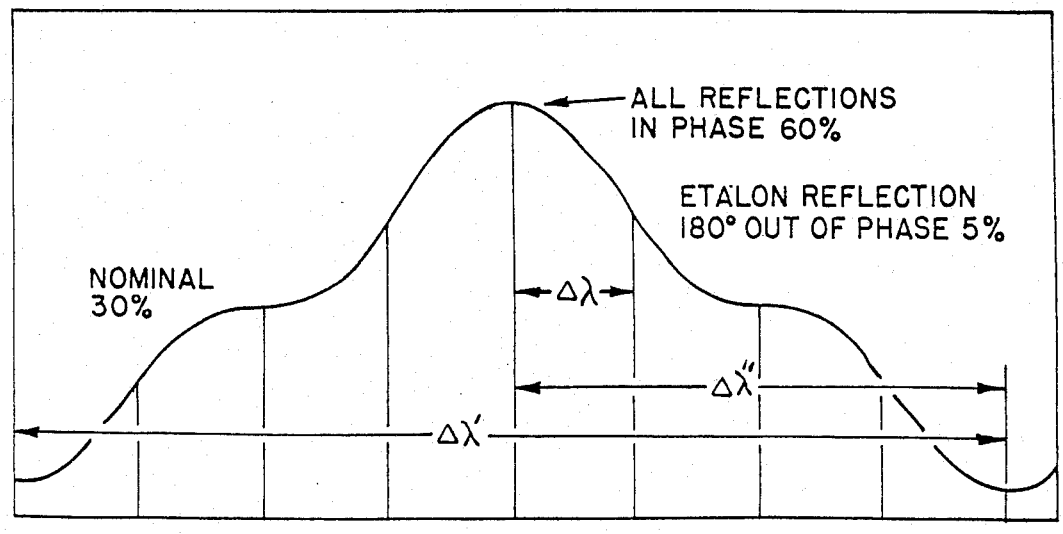
FIG. 2 is a graph showing the relationship between plane wave reflectivity and phase correspondence in the laser diode of FIG. 1.

FIG. 2 shows the large increase in selective reflectivity when all three Fabry Perot conditions are in phase. Although only paraxial rays are fed back into the diode cavity, the resultant modulation of reflectivity with wavelength is sufficient to lower the lasing threshold of a desired longitudinal mode while raising it for others. This results in increased suppression of side modes due to their saturation owing to destructive wavefront interference, photon scattering and photon reabsorption.

A steady-state analysis can be performed to theoretically confirm the side mode suppression. A rate equation analysis is used for a homogenously broaded laser to predict the number of photons in the "i"th longitudinal mode for a laser in continuous operation:

$$\dot{n}_i = K_i(n_i+1) N_2 - n_i/T_{ci}$$

Here $K_i$ is the coupling coefficient (between ith mode photons and the inverted population $N_2$), and each of the $n_i$ photons in the ith mode is expected to remain for time $T_{ci}$ in the cavity. Therefore the steady-state solution (i.e., $\dot{n}_i = 0$) is $$n_i = \frac{K_i N_2 T_{ci}}{1 - K_i N_2 T_{ci}} [1 - K_i N_2 T_{ci}]^{-1}$$

If $X = KN_2T_c$ for some ith mode differs from that of the dominant (preferred) "Zeroth" mode, then $n_i$ must saturate at $$n_i = \frac{1}{1 - X_i/X_o}$$

If no etalon is present, discrepancies in coupling coefficient K determine $X_i/X_o$, but these are small and erratic. In the case of the diode/etalon combination of this invention, $X_i/X_o$ is dominated by $T_{ci}$ (lifetime of ith mode photons in cavity), which is related to losses thus:

$$T_{ci} = \frac{1}{C(\alpha_c + \alpha_m)}$$

Here C is the speed of light, $\alpha_m$ is miscellaneous cavity loss due to scatter and absorption and $\alpha_c$ is coupling loss (includes light leaving cavity):

$$\alpha_c = \frac{1}{2l} \ln \frac{1}{r_F r_B}$$

where $r_F$ and $r_B$ are front 20 and rear 22 diode reflectivities. The etalon's plane wave reflectivity is given by $$r_e = \frac{2r_o(1 + \cos \delta)}{1 + 2r_o \cos \delta + r_o^2}$$

where $$r_o = \frac{(n-1)^2}{n+1}$$

and $\delta$ is the phase accumulation associated with round trip propagation through the etalon:

$$\delta = 2\pi \frac{2nt}{\lambda}$$

Since actual phase fronts impinging on the etalon are nonplanar, $r_e$ must be reduced according to geometrical factors before its effects on $r_F$ can be calculated, but when realistic phase curvatures are figured in, and reflectances calculated, mode discrimination factors $X_i/X_o$ for the unwanted modes turn out to be at most approximately 0.998. Therefore for zeroth mode power $P_o \sim 20$ mW (implying $n_o \sim 10^6$ photons) the most powerful spurious mode should then saturate at $n_i = [1-0.998]^{-1} = 500$ or $P_i = 10 \mu W$. Converting this to a more recognizable unit, a side mode suppression of $\geq 33$ dB should be possible since $$\log_{10} \frac{(10^6)}{500} = 3.3.$$

Figure 3:
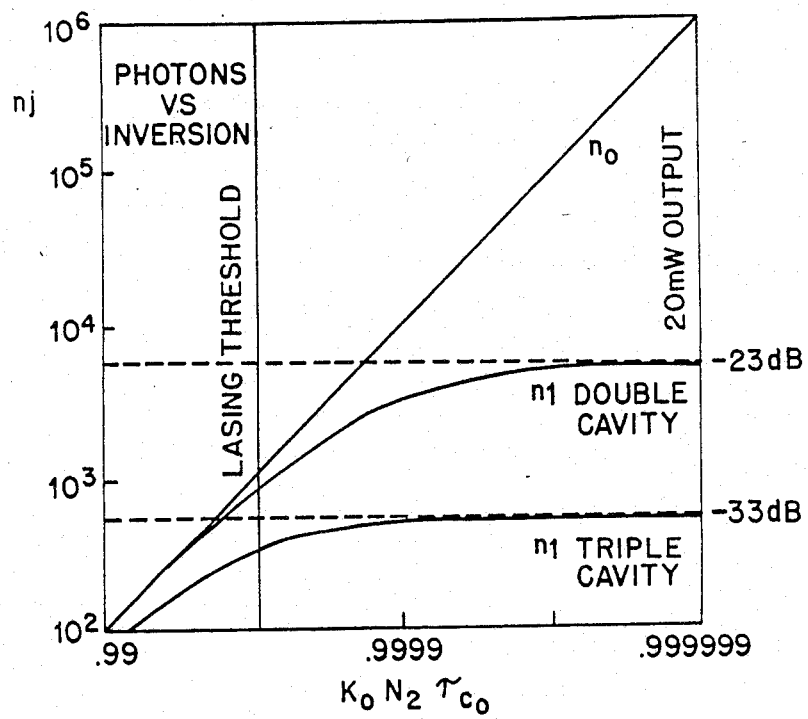
FIG. 3 is a graph comparing the adjacent mode separation of a typical double cavity and the triple cavity laser of the present invention.

The effects of this increase in side mode suppression is graphically shown in FIG. 3. FIG. 3 demonstrates that competing side modes are suppressed better by the three cavity laser than by a conventional two cavity laser at all output levels. This improved mode suppression is particularly important at the lasing threshold bias. Threshold bias is, generally speaking, the minimum bias current required by the laser in order to initiate the dramatic rise in output power which characterizes laser diodes. As can be seen, the separation between the most powerful side mode $n_1$ and the dominant mode $n_o$ at threshold is much greater for the triple cavity laser than for a typical double cavity laser. At threshold the strongest double cavity laser side mode $n_1$ is barely weaker than the dominant mode while side modes are greatly suppressed by the triple cavity laser. This is particularly important because data communication lasers often operate near threshold during pulsed operation. In pulsed operation, the triple cavity laser produces a far cleaner digital signal and it is therefore expected that in fiber optic applications, data transmission rates pulse rates approaching 1 Gb/s may be achieved by the triple cavity laser.

Figures 4A, 4B:
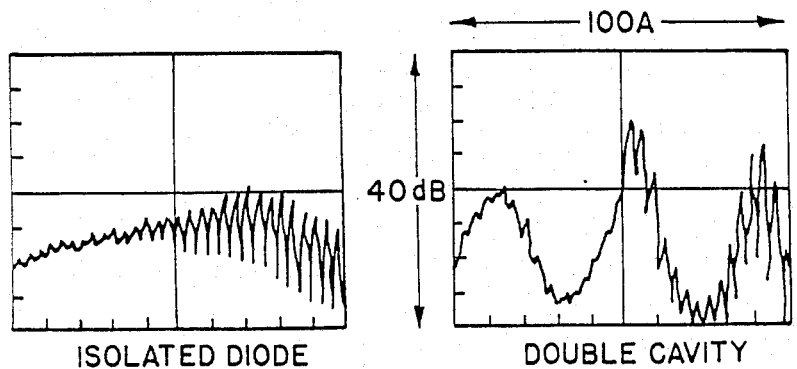
FIGS. 4a, 4b and 4c comprise a spectrographic comparison of a typical isolated diode, a typical double cavity diode and the triple cavity laser of the present invention.
Figure 4C:
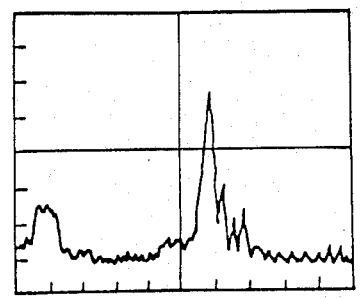

A spectrographic comparison of operating spectrum of the triple cavity semiconductor laser of the present invention, an isolated diode, and a double cavity laser is shown in FIGS. 4a-c. FIG. 4a shows a typical isolated diode operating in the many modes determined by its internal Fabry Perot cavity. FIG. 4b shows a double cavity laser having three dominant Fabry Perot cavity modes. FIG. 4c shows a triple cavity laser having a strong dominant operating mode and greatly diminished side modes.

This improvement in side mode suppression at and above threshold is due to the wavelength specific reflectivity in the resonating cavities stemming from use of the etalon. Power levels above threshold bias current make side mode suppression of 33 dB possible, however, at bias currents far below threshold mode selectivity deteriorates at high pulse rates.

Use of the exteral etalon also makes it possible to tune the semiconductor laser 10 to emit a specific wavelength within the natural emission spectrum of the laser diode. The laser can be tuned in the range of tens of nanometers to coincide with atomic resonance and therefore is useable for precise chemical analysis such as flame spectrometry or emissions analysis.

This turning capability is facilitated by temperature related changes in the refractive index in the laser diode, thermal expansion of the elastic material between the etalon and the diode, and also the thermal expansion of the etalon cavity 25.

Thermal shifting of operative modes within the diode cavity largely depends on the diode cavity's refractive index and is typically about 1 Å/° K.

The back surface 24 of the etalon moves with temperature according to the expansion coefficient of the elastic material (RTV) which is used to attach it to the diode heat sink 14. Consequently, the air gap 23 resonant wavelengths shift according to:

$$\frac{d\lambda}{ds} = \frac{\lambda}{s}$$

but since $$ds/s = \alpha_{RTV} dT,$$

$$[d\lambda/dT]_1 = \lambda \cdot \alpha_{RTV}$$

Dependence on "s" therefore drops out and for a coefficient of expansion of $\alpha RTV = 0.0003/°$ K., $$\frac{d\lambda}{dT} = 2.5 \text{ Å/°K.}$$

A similar calculation shows that the resonant wavelengths of the etalon plus gap cavity depend on expansion of both the RTV and the glass etalon:

$$\frac{d\lambda}{dT} = \lambda \frac{s\alpha_{RTV} + nt\alpha_{Glass}}{s + nt}$$

where $s = 60 \mu m$, $t = 150 \mu m$, then $[d\lambda/dt]_2 = 0.6$ Å/° K. Therefore, where the mode separation ($\Delta\lambda$) equaling about 3 Å, thermal stability of ±0.5° K. may be required to maintain dominance of a particular mode.

A heating and cooling source may be connected to the semiconductor laser 10 to tune the laser 10 to a desired wavelength within the natural operating modes of the laser diode 12. The laser diodes, in turn, are chosen according the their natural modes when a particular discrete wavelength emission is desired.

This semiconductor laser assembly using RTV was also found to be wavelengths stable after non-operating temperature excursions of ±100° C. This ensures long term stability of the device when it is exposed to hostile environments such as during shipping or spacecraft launch.

A factor that might be expected to impair long term stability of the semiconductor laser is possible shrinkage of the elastic material used to attach the etalon to the laser diode. When RTV material, manufactured by the General Electric Company, is used to attach laser diodes to etalons, testing indicates that outgasing and polymer cross-linking effectively cease after 10 days. Properly cured semiconductor lasers of this type should therefore be fully stable after a short curing period.

Another possible change that might affect long term diode stability is due to thermal diffusion of dopants and defects that affect the laser diode gain line. Changes of this nature, of course, would be no worse for the present invention than for other devices utilizing laser diodes. Such changes however, would also affect mode selectivity. A reasonable precaution is to avoid very high operating temperatures. In any case, lab tests have shown the present invention stable for in excess of three months.

Tests of triple cavity lasers have also shown that they are impact stable and that acoustic vibrations do not readily upset emissions. This feature makes use of this laser feasible in transportation and aircraft environment where some vibration is unavoidable.

Lasers incorporating the advantages of the current invention have a great many uses in applications requiring single mode lasers with high power, good beam quality and a tunable narrow band spectrum. Such applications include space based and fiber optic communication systems, and spectroscopy. In all these uses rejection of background radiation and spurious modes prevents signal distortion and attenuation.

Finally, this device is relatively inexpensive to build and can be based on a large number of currently available laser diodes. In spite of its low cost this device has proven to be capable of single mode pulsed operation with excellent efficiency, high waveshape quality and extended life.

While the invention has been particularly described with reference to the preferred embodiment thereof it will be understood by those skilled in the art that various changes and substance and forms may be made therein without departing from the spirit and scope of the invention as defined in the appended claims.

I claim:
1. A semiconductor laser comprising:
   a laser diode having a partially reflective emission surface at an end of a longitudinal axis;
   a first reflective surface external of said laser diode and adjacent to said emission surface; and
   a second reflective surface external of said laser diode which forms the semiconductor laser output surface and is adjacent to said first reflective surface wherein said first and second reflective surfaces are parallel and change the effective reflectivity of said partially reflective emission surface of said laser diode by imposing two external Fabry-Perot cavities in order to increase the operating power of discrete dominant mode emissions and decrease the operating power of side mode emissions at said second reflective surface.

2. A semiconductor laser comprising:
   a laser diode having a plurality reflective front diode surface oriented perpendicular to a longitudinal axis of said laser diode wherein an emission of laser light issues from said partially reflective front diode surface; and
   an external etalon affixed to said laser diode by resilient material, said external etalon receiving said emission of laser light and comprising:
   an external first reflective surface, and
   an internal second reflective surface which forms a semiconductor output surface and in combination with said first reflective surface reflects emissions from said partially reflective diode front surface in a manner which increases operating power of discrete single mode emissions and decreases operating power of side mode emissions by imposing two Fabry-Perot cavities external to said laser diode.

3. The semiconductor laser of claim 2 wherein said etalon is attached to said laser diode by an elastic material at a surface removed from said emission surface.

4. The semiconductor laser of claim 2 wherein said etalon is attached to said laser diode by room temperature vulcanizing rubber.

5. The semiconductor laser of claim 2 wherein said laser diode has a single lobe far field pattern.

6. The semiconductor laser of claim 2 wherein the dominant emission of said semiconductor laser has a wavelength satisfying three Fabry Perot resonance conditions which are established by:
   (i) the internal cavity of said laser diode;
   (ii) the space between said laser diode and said first reflective surface; and
   (iii) the space between said laser diode and said second reflective surface.

7. The semiconductor laser of claim 6 wherein the discrete dominant single mode emission of said semiconductor laser has a wavelength satisfying the following conditions:

$$m\lambda = 2Nl \qquad (1)$$

$$(m' + \tfrac{1}{2})\lambda = 2s; \qquad (2)$$

$$m''\lambda = 2(nt + s); \qquad (3) \text{ and}$$

wherein m, m' + and m'' are arbitrary integers, "λ" is the wavelength of the dominant emission, "s" is the distance between the laser diode and said first reflective surface of said etalon, "n" is the refractive index of the etalon material and "t" is the etalon thickness.

8. The semiconductor laser of claim 2 wherein said semiconductor laser is a functional single mode laser at threshold bias.

* * * * *